United States Patent [19]

Sauer

[11] Patent Number: 5,455,535
[45] Date of Patent: Oct. 3, 1995

[54] RAIL TO RAIL OPERATIONAL AMPLIFIER INTERMEDIATE STAGE

[75] Inventor: Don R. Sauer, San Jose, Calif.

[73] Assignee: National Semiconductor Corporation, Santa Clara, Calif.

[21] Appl. No.: 205,573

[22] Filed: Mar. 3, 1994

[51] Int. Cl.⁶ ..................................................... H03F 3/45
[52] U.S. Cl. .......................... 327/560; 327/563; 330/257
[58] Field of Search ............................ 327/560, 561–563, 327/576; 330/252, 253, 257, 261, 264; 323/315

[56] References Cited

U.S. PATENT DOCUMENTS

| | | | |
|---|---|---|---|
| 4,333,058 | 6/1982 | Hoover | 330/253 |
| 4,532,479 | 7/1985 | Blauschild | 330/261 |
| 4,555,673 | 11/1985 | Huijsing et al. | 330/252 |
| 4,560,947 | 12/1985 | Frey | 330/254 |
| 4,600,893 | 7/1986 | Sugimoto | 330/252 |
| 4,804,904 | 2/1989 | Katakura | 330/252 |
| 5,153,529 | 10/1992 | Koda et al. | 330/257 |

*Primary Examiner*—Timothy P. Callahan
*Assistant Examiner*—T. Lam
*Attorney, Agent, or Firm*—Limbach & Limbach; H. Donald Nelson; Vince Pitruzzella; Alan S. Hodes

[57] ABSTRACT

An interstage circuit functions to combine a first differential voltage and a second differential voltage, the first and second differential voltages being either positive or negative, to produce a current at a single ended output. A first pair of PNP transistors generates a first current corresponding to the first differential voltage, if positive, summed with a first bias current. A first pair of NPN transistors generates a second current corresponding to the second differential voltage, if positive, summed with a second bias current. A second pair of PNP transistors generates a third current corresponding to the first differential voltage, if negative, summed with the second current. A second pair of NPN transistors generates a fourth current corresponding to the second differential voltage, if negative, summed with the first current. The third current is subtracted from the fourth current to produce the current at the single ended output.

14 Claims, 3 Drawing Sheets

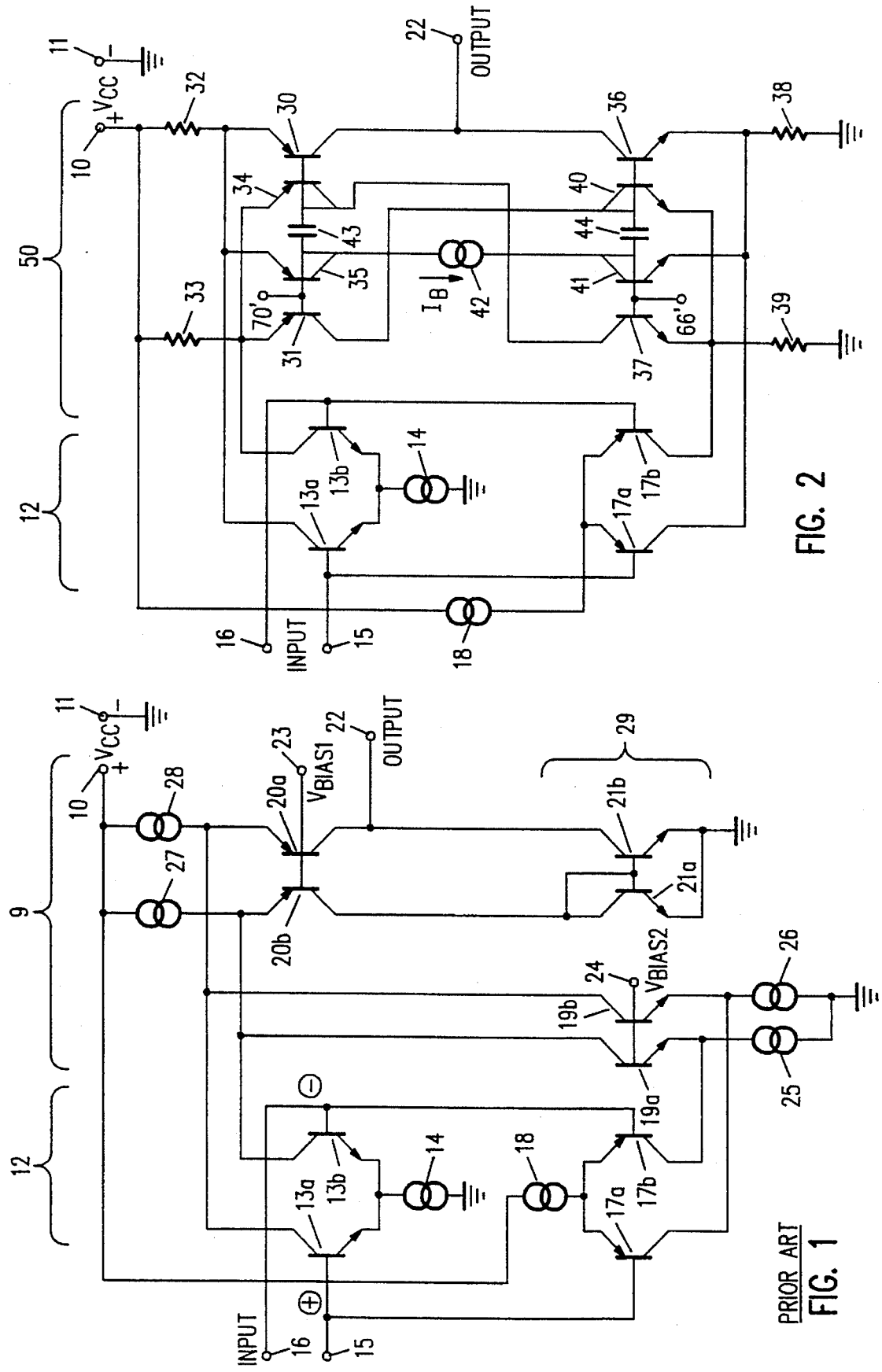

RAIL TO RAIL OPERATIONAL AMPLIFIER INTERMEDIATE STAGE

BACKGROUND OF THE INVENTION

A rail to rail operational amplifier includes three stages: an input stage, an intermediate stage, and an output stage.

Copending patent application, entitled RAIL TO RAIL OPERATIONAL AMPLIFIER OUTPUT STAGE, Ser. No. 08/148121, filed Nov. 5, 1993 and commonly assigned herewith to National Semiconductor Corporation, the assignee of the present invention, discloses an output stage capable of driving capacitive loads with stable operation.

FIG. 1 is a schematic diagram illustrating an operational amplifier input stage circuit 12, which is the composite input section disclosed in U.S. Pat. No. 4,532,479 ("the '479 patent"), issued Jul. 30, 1985. The input stage is coupled to a well-known intermediate stage circuit 9.

The input stage circuit 12 operates from a $V_{CC}$ power supply connected+to terminal 10 and - to ground terminal 11. The input stage 12 has positive and negative differential voltage input terminals 16 and 15, respectively, connected to the bases of first and second NPN input transistors 13a and 13b, respectively, and to the bases of first and second PNP input transistors 17a and 17b, respectively. That is, first and second NPN input transistors 13a, 13b and first and second PNP transistors 17a, 17b are complementary long-tailed transistor pairs having commonly connected inputs.

The NPN input transistors 13a, 13b are operated differentially by a constant tail current source 14 connected between ground reference and the commonly-connected emitters of the NPN input transistors 13a, 13b to provide a first amplified differential signal at their collectors.

The PNP input transistors 17a, 17b are operated differentially by a constant tail current source 18 connected between $V_{CC}$ and the interconnected emitters of the PNP input transistors 17a, 17b to provide a second amplified differential signal at their collectors.

As discussed in the '479 patent, the ground to $V_{CC}$ common-mode range is divided into three distinct parts: a low range from ground reference to $V_{BE}$, a middle range from $V_{BE}$ to $V_{CC}-V_{BE}$, and a high range from $V_{CC}-V_{BE}$ to $V_{CC}$. When the common-mode portion of the differential input signal is below $V_{BE}$, the NPN input transistors 13a, 13b turn are off since their base to emitter voltages are below the $V_{BE}$ needed for conduction; PNP input transistors 17a, 17b are on. When the common-mode portion of the differential input signal is in the middle range, NPN input transistors 13a, 13b and PNP input transistors 17a, 17b are all on to provide input signal amplification. When the common-mode voltage is above $V_{CC}-V_{BE}$, the PNP input transistors 17a, 17b are off, and the NPN input transistors 13a, 13b are on.

Referring now to the conventional intermediate stage 9 of FIG. 1, the pair of NPN input transistors 13a, 13b of the input stage 12 have their collectors connected to the emitters of a pair of identical common-base PNP transistors 20a and 20b. A current source 27 is connected to the emitter of PNP transistor 20a and a current source 28 is connected to the emitter of the PNP transistors 20b. A constant voltage source $V_{BIAS1}$ is connected to the common bases of the common-base PNP transistors 20a and 20b.

In a complementary fashion to the NPN input transistors 13a, 13b, the pair of PNP input transistors 17a, 17b of the input stage 12 have their collectors connected to the emitters of a pair of identical common-base NPN transistors 19a and 19b. A current sink 25 is connected to the emitter of NPN transistor 19a and a current sink 26 is connected to the emitter of the NPN transistor 19b. A constant voltage source $V_{BIAS2}$ is connected to the common bases of the common-base NPN transistors 19a and 19b.

The collectors of the common-base NPN transistors 19a, 19b are connected to emitters of the common-base PNP transistors 20a, 20b, respectively. The collectors of the common-base NPN transistors 20a, 20b are connected to the collectors of NPN transistors 21a, 21b of a current mirror 29. The NPN transistor 21a has its collector shorted to its base.

Current mirrors are well-known in the art and are discussed, for example, on pp. 88–91 of Horowitz and Hill, *The Art of Electronics*. By shorting the collector of transistor 21a to its base, the collector of common-base transistor 21a is forced to carry or sink a current that is equal in magnitude to the current through transistor 21b.

The bias voltage $V_{BIAS1}$, and the constant currents of the constant current sources 27, 28, are set such that the collector currents of the NPN input transistors 13a, 13b flow during entire signal swings at their collectors. Similarly, the bias voltage $V_{BIAS2}$, and the constant currents of the constant current sources 25, 26, are set such that the collector currents of the PNP input transistors 17a, 17b flow during entire signal swings at their collectors. Such a voltage biasing scheme is well-known in the art and is described, for example, on pp. 69–70 of Horowitz and Hill, *The Art of Electronics*.

The circuit of FIG. 1 operates generally as follows in amplifying a voltage difference between input terminals 15 and 16 to provide a corresponding current at an output terminal 22. As discussed above, assuming the common-mode portion of the input signal is in the middle range, the NPN input transistors 13a, 13b and the PNP input transistors 17a, 17b are turned on.

The NPN input transistor pair 13a, 13b amplify the input voltage difference to produce a current difference between their collectors. This current difference causes a corresponding current difference between the emitters of the PNP transistor pair 20a, 20b.

Likewise, the PNP input transistor pair 17a, 17b amplify the voltage difference between their collectors to produce a corresponding current difference between their collectors. This current difference causes a corresponding current difference between the emitters of the NPN transistor pair 19a, 19b, which further contributes a current difference between the emitters of the PNP transistor pair 20a, 20b.

The current through the transistor 21a of the current mirror 29 equals the current through the PNP transistor 20a. Since the current through the transistor 21b is forced to equal the current through the transistor 21a, the output current at an output terminal 22 corresponds to the current difference between the NPN transistor pair 13a, 13b summed with the current difference between the PNP transistor pair 17a, 17b.

The intermediate stage circuit 9 has several problems. First, in order to keep the gain of the intermediate stage constant regardless of the common mode input voltage, the components of the intermediate stage must be chosen such that all currents have unity gain to the output node 22. As a consequence, all of the transistors' noise and offset also have unity gain to the output node 22.

In addition, the conventional intermediate stage dissipates a relatively large amount of power.

Furthermore, when the differential input signal at the input stage changes with high frequency, the output of the conventional intermediate stage circuit shifts in phase, relative to the input, up to 180 degrees, at which point the output of the conventional intermediate stage begins to oscillate.

SUMMARY OF THE INVENTION

The circuit according to the present invention is an operational amplifier intermediate stage that combines four input stage output currents, from an input stage such as is disclosed in the '479 patent, in a manner that permits input stage optimization. The present invention intermediate stage circuit provides a single-ended output suitable for driving an output stage such as is disclosed in the second copending patent application.

The present invention provides an interstage circuit, having positive and negative power supply rails connectable to a source of operating power, and functioning to combine two differential inputs, a first differential input being a first differential current, from an input stage NPN transistor differential amplifier and a second differential input, being a second differential current, from an input stage PNP transistor differential amplifier, to produce a single ended output suitable for driving a rail to rail output stage.

The interstage circuit comprises:

first means for generating a first current corresponding to the first differential voltage, based on the first differential current, if positive, summed with a first bias current;

second means for generating a second current corresponding to the second differential voltage, based on the second differential current, if positive, summed with a second bias current;

third means for generating a third current corresponding to the first differential voltage, if negative, summed with said second current; and fourth means for generating a fourth current corresponding to the second differential voltage, if negative, summed with said first current; and fifth means, for subtracting said third current from said fourth current to produce the current at the single ended output.

In a preferred embodiment, the first means comprises first and second PNP transistors. The emitters of the first and second PNP transistors are coupled to receive the first differential voltage. The base of the first PNP transistor connected to the base of the second PNP transistor, and the collector of the first PNP transistor connected to the base of the first PNP transistor.

The second means comprises first and second NPN transistors. The emitters of first and second NPN transistors are coupled to receive the second differential voltage. The base of the first NPN transistor is connected to the base of the second NPN transistor, and the collector of the first NPN transistor is connected to the base of the first NPN transistor.

The third means comprises third and fourth PNP transistors. The emitters of the third and fourth PNP transistors are also coupled to receive the first differential input voltage. The base of the third PNP transistor is connected to the base of the fourth PNP transistor, the collector of the third PNP transistor is connected to the base of the third PNP transistor, the emitter of the third PNP transistor is connected to the emitter of the second PNP transistor, and the emitter of the fourth PNP transistor is connected to the emitter of the first PNP transistor.

The fourth means comprises third and fourth NPN transistors. The emitters of third and fourth NPN transistors are also coupled to receive the second differential voltage. The base of the third NPN transistor is connected to the base of the fourth NPN transistor, the collector of the third NPN transistor is connected to the base of the third NPN transistor, the emitter of the third NPN transistor is connected to the emitter of the second NPN transistor, and the emitter of the fourth NPN transistor is connected to the emitter of the first NPN transistor.

In the preferred embodiment, a first resistor couples the emitters of the first and fourth PNP transistors to the positive power supply rail, and a second resistor couples the emitters of the second and third PNP transistors to the positive power supply rail to generate the first differential voltage based on the first differential current. A third resistor couples the emitters of the first and fourth NPN transistors to the negative power supply rail, and a fourth resistor couples the emitters of the second and third NPN transistors to the negative power supply rail to generate the second differential voltage based on the second differential current.

The collector of the third PNP transistor is coupled to the collector of the second NPN transistor, and the collector of the first PNP transistor is coupled to a substantially constant current source. The collector of the first NPN transistor is also coupled to the current source.

The collector of the fourth PNP transistor is coupled to the collector of the fourth NPN transistor, and the single ended current output appears at an output node between the collector of the fourth PNP transistor and the collector of the fourth NPN transistor.

A better understanding of the features and advantages of the invention will be obtained by reference to the following detailed description and accompanying drawings which set forth an illustrative embodiment in which the principles of the invention are utilized.

BRIEF DESCRIPTION OF THE DRAWING

FIG. 1, is a simplified schematic diagram illustrating a prior art operational amplifier intermediate stage and its relationship to an input stage.

FIG. 2 is a simplified schematic diagram illustrating an operational amplifier intermediate stage in accordance with the present invention and its relationship to the input stage of FIG. 1.

DETAILED DESCRIPTION OF THE INVENTION

Figure 3:
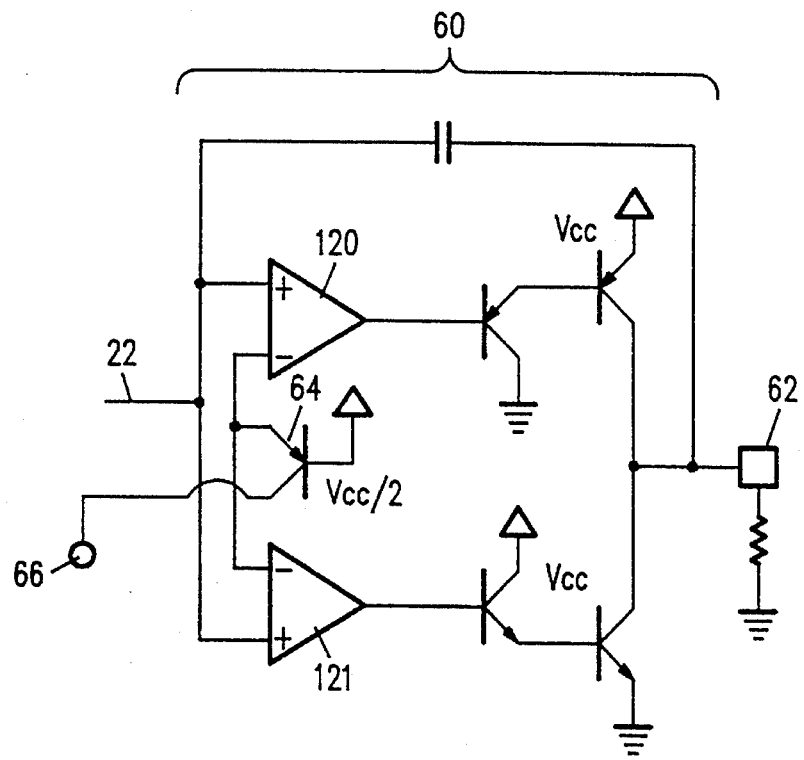
FIG. 3 is a simplified schematic diagram illustrating an operational amplifier output stage and its interconnection with the intermediate stage of FIG. 2.
Figure 4:
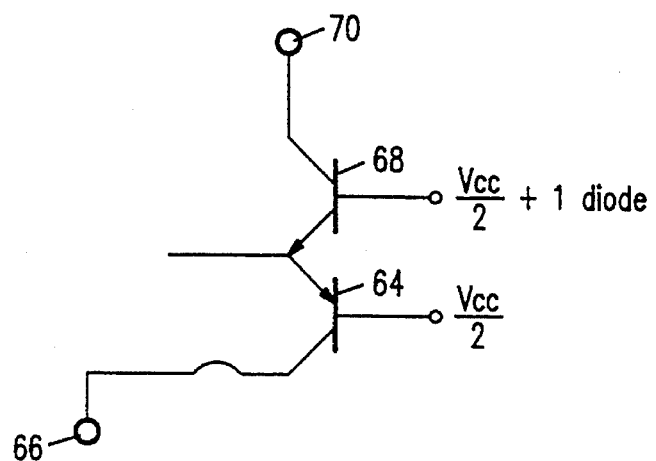
FIG. 4 is a simplified schematic diagram illustrating a biasing voltage source of the amplifier output stage of FIG. 3 and its interconnection with the intermediate stage of FIG. 2.

The invention will now be described with reference to FIG. 2. Where the components are the same as those of FIG. 1, they are given the same reference designations. For example, the input stage 12 shown in FIG. 2 is identical to the input stage 12 shown in FIG. 1.

Throughout the specification, including in the claims, the term "connected" means a direct electrical connection between the things connected, with no intermediate devices.

The term "coupled" means either a direct connection, with no intermediate devices, or an indirect connection through one or more passive or active intermediate devices.

Like the conventional intermediate stage circuit shown in FIG. 1, the intermediate stage circuit 50 of FIG. 2 combines the four inputs, from the collectors of rail to rail input stage 12 NPN input transistors 13a, 13b, and PNP input transistors 17a, and 17b to produce a single ended output at output terminal 22. The input stage 12 is shown only for the purpose of describing the present invention intermediate stage 50. The input stage 12 does not form part of the present invention.

The collector of NPN input transistor 13a is coupled to the $V_{CC}$ rail by a first resistor 32. A first PNP transistor 35 has its base coupled to its collector. The collector of NPN input transistor 13a is further coupled to the emitter of the first PNP transistor 35, and the base/collector of the first PNP transistor 35 is coupled to a constant current source 42, which produces a constant bias current $I_B$. Therefore, the collector current of the first PNP transistor 35 is equal to the constant current $I_B$. One skilled in the art will appreciate that the first PNP transistor 35, with its base coupled to its collector, is equivalent to a forward biased diode.

The collector of input transistor 13b is coupled to the $V_{CC}$ rail by a second resistor 33, which is matched to the first resistor 32. The collector of input transistor 13b is further coupled to the emitter of a second PNP transistor 31, with the base of the second PNP transistor 31 connected to the base/collector of the first PNP transistor 35. The PNP transistor 31 is matched to the PNP transistor 35.

The operation of the first and second PNP transistors 35, 31 and the first and second resistors 32, 33 can be understood by assuming, first, that the common-mode voltage is in the upper range, i.e. above $V_{CC}-V_{BE}$, so that the NPN input transistors 13a, 13b are on and the PNP input transistors 17a, 17b are off; and second, that there is no differential input signal at the terminals 15, 16. If there is no differential input signal at the terminals 15, 16, there is no amplified differential signal at the NPN input transistors 13a, 13b collectors (i.e. the NPN input transistor 13a collector current is equal to the NPN input transistor 13b collector current).

It then follows that the current through the first resistor 32 is equal to the current through the second resistor 33. Since the first resistor 32 is matched to the second resistor 33, the voltage difference across the first resistor 32 is equal to the voltage difference across the second resistor 33, and the emitter voltage of the first PNP transistor 35 is equal to the emitter voltage of the second PNP transistor 31. The base of the first PNP transistor 35 is tied to the base of the second PNP transistor 31, so the $V_{BE}$ of the first PNP transistor 35 is equal to the $V_{BE}$ of the second PNP transistor 31. The second PNP transistor 31 is matched to the first PNP transistor 35, so their collector currents are equal. Thus, since the first PNP transistor 35 collector current is fixed at $I_B$, the second PNP transistor 31 collector current is also $I_B$.

Now, turning for the moment away from the first and second PNP transistors 35, 31, a first NPN transistor 41 has its collector and base coupled to the constant current source 42 and its emitter coupled to the ground rail by a third resistor 38. Thus, it can be seen that the first NPN transistor 41 collector current is $I_B$.

A second NPN transistor 37 has its base connected to the base of the first NPN transistor 41 and its emitter coupled to the ground rail by a fourth resistor 39. The fourth resistor 39 is matched to the third resistor 38. Due to the connection of the base of the first NPN transistor 41 and to the base of the second NPN transistor, and since the emitter of the first NPN transistor and the emitter of the second NPN transistor are at the same voltage, the collector current of the second NPN transistor 37 is equal to the collector current of the first NPN transistor 41, $I_B$.

The collector of the NPN input transistor 13b, coupled to the $V_{CC}$ rail by the second resistor 33, is further coupled to the emitter of a third PNP transistor 34. The base of the third PNP transistor 34 is connected to the collector of the third PNP transistor 34. The collector of the third PNP transistor 34 is coupled to the collector of the second NPN transistor 37, and therefore the collector of the third PNP transistor 34 conducts the same amount of current as the collector of the second NPN transistor 37. Thus, since the collector current of the second NPN transistor 37 is $I_B$, the collector current of the third PNP transistor 34 is also $I_B$.

The NPN input transistor 13a, coupled to the $V_{CC}$ rail by the first resistor 32, has its collector further coupled to the collector of a fourth PNP transistor 30. The base of the fourth PNP transistor 30 is coupled to the base of the third PNP transistor 34. Since the voltage level of the emitter of the fourth PNP transistor 30 emitter is the same as the voltage level of the emitter of the third PNP transistor 34, and the base of the fourth PNP transistor 30 is coupled to the base of the third PNP transistor 34, the $V_{BE}$ of the fourth PNP transistor 30 is equal to the $V_{BE}$ of the third PNP transistor 34. As a result, the collector current of the fourth PNP transistor 30 is equal to the collector current of the third PNP transistor 34, $I_B$.

A third NPN transistor 40 has its emitter coupled to the ground rail by the fourth resistor 39 and its collector coupled to the collector of the second PNP transistor 31. The third NPN transistor 40 has its base coupled to its collector. Since the collector of the third NPN transistor 40 is coupled to the collector of the second PNP transistor 31, the collector current of the third NPN transistor 40 is equal to the collector current of the second PNP transistor 31, $I_B$.

A fourth NPN transistor 36 has its emitter coupled to ground by the first resistor 38, and its base coupled to the third NPN transistor 40 base/collector. Since the emitter voltage of the fourth NPN transistor 36 is equal to the emitter voltage of the third NPN transistor 40, the collector current of the fourth NPN transistor 36 is equal to the collector current of the third NPN transistor 40, $I_B$.

The current at the intermediate stage output 22, corresponding to the current difference between the NPN input transistors 13a, 13b collectors summed with the current difference between the PNP input transistor 17a, 17b collectors, is the collector current of the fourth PNP transistor 30 minus the collector current of the fourth NPN transistor 36, $I_B-I_B$, which equals 0.

In response to a differential signal between the + input 15 and the − input 16 of the input stage 12, there becomes a difference between the NPN input transistor 13a current and the NPN input transistor 13b current. If, for example, the + input 15 voltage is higher than the − input 16 voltage, the NPN input transistor 13a current is higher than the NPN input transistor 13b current.

Following through with this example, and still assuming the common mode voltage to be above $V_{CC}-V_{BE}$, the current through the first resistor 32 becomes greater than the current through the second resistor 33. As a result, the emitter voltage of the first PNP transistor 35 becomes lower than the emitter voltage of the second PNP transistor 31, which lowers the base voltage of the first PNP transistor 35. Since the base of the second PNP transistor 31 base is coupled to the base of the first PNP transistor 35, the second PNP transistor 31 responds to this lowered base voltage by conducting additional current at its collector. Specifically, while the collector current of the first PNP transistor 35 remains at $I_B$, the collector current of the second PNP transistor 31 is greater than $I_B$ by the amount the NPN input transistor 13a collector current exceeds the 13b collector current.

As discussed above, the collector current of the third NPN transistor 40 always equals the collector current of the second PNP transistor 31. Thus, the collector current of the third NPN transistor 40 also exceeds $I_B$ by the amount the NPN input transistor 13a collector current exceeds the 13b collector current. The collector current of the fourth NPN transistor 36 equals the collector current of the third NPN transistor 40 since the emitter of the fourth NPN transistor 36 and the emitter of the third NPN transistor 40 are at the same voltage (the PNP input transistors 17a and 17b are off).

The collector current of the third PNP transistor 34, the collector current of the fourth PNP transistor 30, the collector current of the second NPN transistor 41, and the collector current of the second NPN transistor 37 are unaffected when the NPN input transistor 13a collector current exceeds the 13b collector current, and thus they remain at $I_B$.

Thus, the current at the intermediate stage output 22 exhibits the amount by which the NPN input transistor 13a collector current exceeds the 13b collector current.

When the − input 16 voltage exceeds the + input 15 voltage, the NPN input transistor 13b collector current exceeds the NPN input transistor 13a collector current. As a result, the current through the second resistor 33 exceeds the current through the first resistor 32, the voltage at the emitter of the third PNP transistor is lowered, and thus the voltage at the base of the third PNP transistor 34 is lowered. Since the base of the fourth PNP transistor 30 is connected to the base of the third PNP transistor 34, the third PNP transistor 34 responds to this lowered base voltage by conducting additional current at its collector. Specifically, the collector current of the third PNP transistor 34 remains at $I_B$ and the collector current of the fourth PNP transistor 30 is greater than $I_B$ by the amount the NPN input transistor 13b collector current exceeds the NPN input transistor 13a collector current. The collector current of the first PNP transistor 35 remains at $I_B$, as does the collector current of the second PNP transistor 31, the collector current of the first NPN transistor 41, and the collector current of the fourth NPN transistor 36. The collector current of the first NPN transistor 41 and the collector current of the second NPN transistor 37 also remain at $I_B$.

The current at the intermediate stage output 22, which is the difference between the collector current of the fourth NPN transistor 36 and the collector current of the fourth PNP transistor 30, thus exhibits the amount by which the NPN input transistor 13b collector current exceeds the NPN input transistor 13a collector current.

The PNP input transistor 17a is coupled to the ground rail by the resistor 38 and the PNP input transistor 17b is coupled to the ground rail by the resistor 39. By the symmetrical nature of the intermediate stage 50, it can be seen that, when the input common mode voltage is less than $V_{BE}$, when the PNP input transistors 17a and 17b are on and the NPN input transistors 13a and 13b are off, the current at the intermediate stage output 22 exhibits the difference between the PNP input transistor 17a collector current and the PNP input transistor 17b collector current.

Furthermore, when the common mode voltage is in the middle range, i.e. between $V_{BE}$ and $V_{CC}-V_{BE}$, and the NPN input transistors 13a, 13b and the PNP input transistors 17a, 17b are all on, the principle of superposition, which is well-known to those of ordinary skill in the art, may be applied. By the principle of superposition, the current at the intermediate stage output exhibits the difference between the NPN input transistor 13a collector current and the NPN input transistor 13b collector current, summed with the difference between the PNP input transistor 17a collector current and the PNP input transistor 17b collector current.

Figure 5:
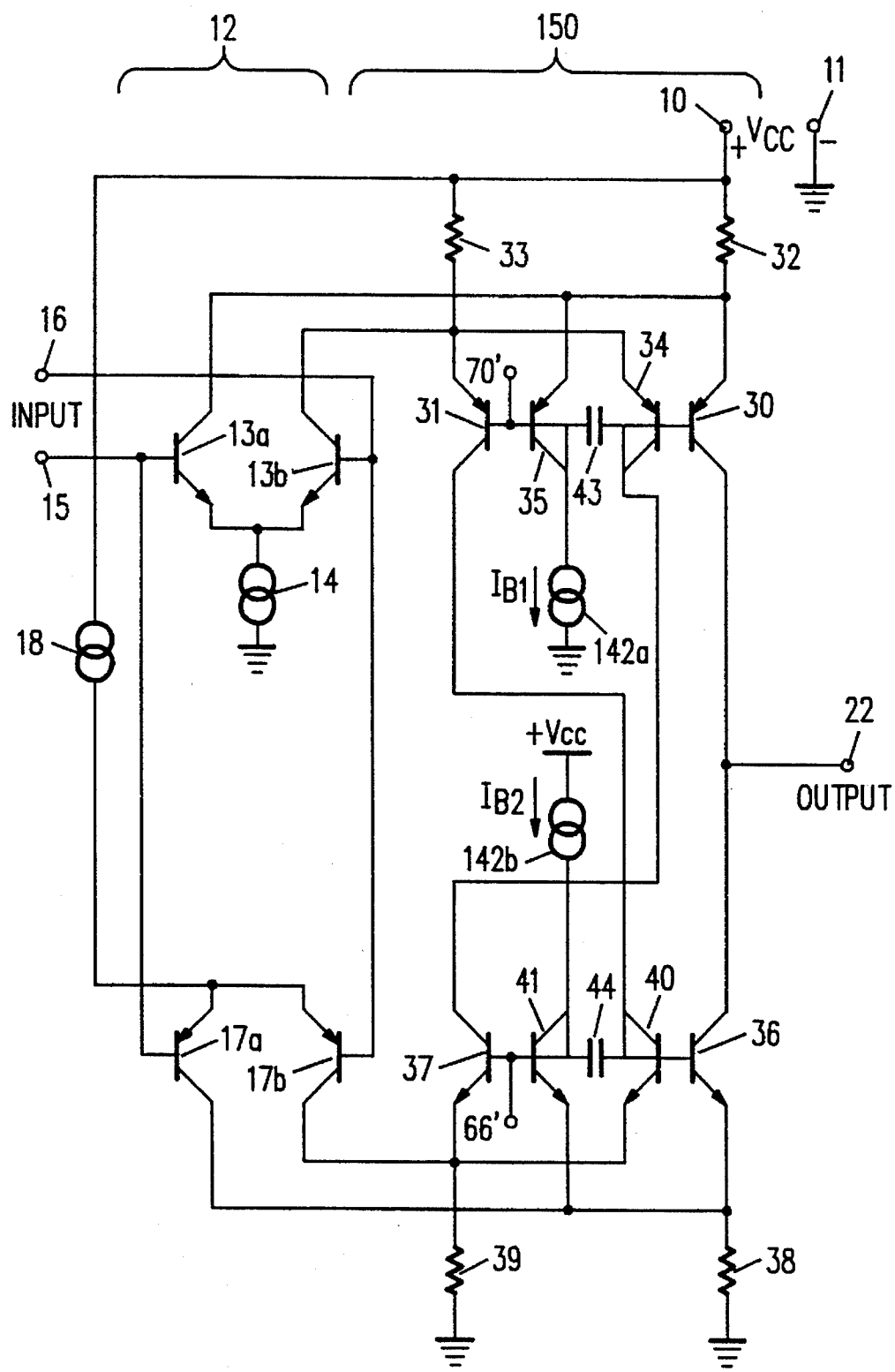
FIG. 5 is a simplified schematic diagram illustrating an alternate embodiment of the operational amplifier intermediate stage of FIG. 2.

The inventor recognized that with the cross-coupling configuration of an intermediate stage 50 in accordance with the present invention, a single constant current source 42 can replace the four constant current sources 25, 26, 27 and 28 of the conventional intermediate stage circuit (of FIG. 1), which allows a present invention intermediate stage circuit 9 to operate at a relatively lower power. Alternatively, referring to FIG. 5, an equivalent intermediate stage circuit 150 in accordance with the present invention utilizes two constant current sources 142a, 142b, in place of the single constant current source 42 of the intermediate stage circuit 50 (of FIG. 2) to generate first and second bias currents, $I_{B1}$ and $I_{B2}$, respectively. Preferably, $I_{B1}$ is equal to $I_{B2}$.

Furthermore, the single current source also replaces the biasing voltage sources of the conventional intermediate stage circuit, providing a biasing current to keep the transistors of the intermediate stage 50 operating over the common-mode operating range of the input stage.

Furthermore, the offset of an intermediate stage in accordance with the present invention is much reduced from the offset of a conventional intermediate stage. Offset can be conceptualized as "DC noise" in a transistor's collector current, which is caused in many cases by transistor mismatch. The offset of a transistor collector current is most evident when a non-zero output from the intermediate stage results even in the absence of amplified differential signals from the NPN input transistors 13a, 13b and the PNP input transistors 17a, 17b. Since offset increases with increased transistor collector current, and an intermediate stage in accordance with the present invention runs with less collector current than the conventional intermediate stage, the intermediate stage in accordance with the present invention results in lower offset than the conventional intermediate stage.

An intermediate stage in accordance with the present invention may be combined with an output stage in accordance with the copending patent application, which is herein incorporated by reference. Such an output stage 60 is shown in simplified form in FIG. 3. However, in response to current loading at the output 62 of the output stage 60, a resulting current, from the amplifiers 120, 121 appears at the node 22 of the intermediate stage 50. In a preferred embodiment of the present invention, the resulting current is not ignored, since it is non-negligible. The resulting current appears as signal offset which appears to lower the open loop gain of the overall operational amplifier.

In particular, the output stage of the copending application employs a $V_{CC}/2$ biasing voltage to ensure that the differential amplifiers 120, 121 are on throughout the entire common-mode range. In one possible embodiment, the $V_{CC}/2$ biasing voltage employs a voltage buffer PNP transistor 64, where the emitter of the voltage buffer PNP transistor 64 is connected to the inverting inputs of the differential amplifiers 120, 121 of the output stage, and the base of the voltage buffer PNP transistor is connected to a $V_{CC}/2$ voltage source. In this embodiment, the voltage buffer transistor 64 collector is connected to a terminal 66. The terminal 66 is connected to a terminal 66', which is connected to the base of the second NPN transistor 37. The voltage buffer transistor 64 collector current cancels out the input bias currents of the amplifiers 120, 121.

In an alternate embodiment, shown in FIG. 3, the emitter of the voltage buffer PNP transistor 64 is further connected to the emitter of a voltage buffer NPN transistor 68. The base of the voltage buffer NPN transistor is connected to a $V_{cc}/2+1$ diode voltage source. The voltage buffer NPN transistor 68 collector is connected to a terminal 70. The terminal 70 is connected to a terminal 70', which is connected to the base of the second PNP transistor 31. The voltage buffer NPN transistor 68 cancels out the input bias currents of the amplifiers 120, 121 if the net DC polarity is inclined to pull current out of the transistor 68 emitter.

In a still further preferred embodiment of the present invention, the base of the PNP transistor 35 is coupled to the base of the PNP transistor 34 by a capacitor 43, and the base of the NPN transistor 41 is coupled to the base of the NPN transistor 40 by a capacitor 44. At high input signal frequencies, the capacitors 43, 44 short out, resulting in elimination of the cross-coupling. As a result, at high frequencies, most of the devices are eliminated from the signal path, which lowers the gain and thus lowers the phase delay at the intermediate stage output 22 relative to the NPN input transistors 13a, 13b and PNP input transistors 17a, 17b collector currents, which increases the stability of the intermediate stage circuit 50.

What is claimed is:

1. An interstage circuit, having positive and negative power supply rails connectable to a source of operating power, and functioning to combine two differential inputs, a first differential input being from an input stage NPN transistor differential amplifier and a second differential input being from an input stage PNP transistor differential amplifier, to produce a single ended output suitable for driving a rail to rail output stage, said interstage circuit comprising:

first and second PNP transistors, the emitters of said first and second PNP transistors coupled to receive the first differential input, the base of said first PNP transistor connected to the base of said second PNP transistor, and the collector of said first PNP transistor connected to the base of said first PNP transistor;

third and fourth PNP transistors, the emitters of said third and fourth PNP transistors coupled to receive the first differential input, the base of said third PNP transistor connected to the base of said fourth PNP transistor, and the collector of said third PNP transistor connected to the base of said third PNP transistor, the emitter of said third PNP transistor connected to the emitter of said second PNP transistor, and the emitter of said fourth PNP transistor connected to the emitter of said first PNP transistor;

first and second NPN transistors, the emitters of said first and second NPN transistors coupled to receive the second differential input, the base of said first NPN transistor connected to the base of said second NPN transistor, and the collector of said first NPN transistor connected to the base of said first NPN transistor;

third and fourth NPN transistors, the emitters of said third and fourth NPN transistors coupled to receive the second differential input, the base of said third NPN transistor connected to the base of said fourth NPN transistor, and the collector of said third NPN transistor connected to the base of said third NPN transistor and, further, coupled to receive the collector current of the second PNP transistor, the emitter of said third NPN transistor connected to the emitter of said second NPN transistor, and the emitter of said fourth NPN transistor connected to the emitter of said first NPN transistor;

a first resistor that couples the emitters of the first and fourth PNP transistors to the positive power supply rail;

a second resistor that couples the emitters of the second and third PNP transistors to the positive power supply rail;

a third resistor that couples the emitters of the first and fourth NPN transistors to the negative power supply rail;

a fourth resistor that couples the emitters of the second and third NPN transistors to the negative power supply rail;

means for coupling the collector of the third PNP transistor to the collector of the second NPN transistor; and means for coupling the collector of the first PNP transistor to a first substantially constant current source having a first current;

means for coupling the collector of the first NPN transistor to a second substantially constant current source having a second current, said second current being substantially equal to said first current; and means for coupling the collector of the fourth PNP transistor to the collector of the fourth NPN transistor, wherein the single ended output appears at an output node between the collector of the fourth PNP transistor and the collector of the fourth NPN transistor.

2. The interstage circuit of claim 1, wherein said second current source is said first current source.

3. The interstage circuit of claim 1, wherein said first resistor is matched to said second resistor.

4. The interstage circuit of claim 1, wherein said third resistor is matched to said fourth resistor.

5. The interstage circuit of claim 1, wherein said first resistor is matched to said second resistor, and said third resistor is matched to said fourth resistor.

6. The interstage circuit of claim 1 further comprising:

a first frequency compensation capacitor connected between the base of said first PNP transistor and the base of said third PNP transistor; and a second frequency compensation capacitor connected between the base of said first NPN transistor and the base of said third NPN transistor whereby the gain of said interstage circuit is lowered for high frequency inputs.

7. An combined interstage and output stage circuit, the interstage circuit having positive and negative power supply rails connectable to a source of operating power, and functioning to combine two differential inputs, a first differential input being from an input stage NPN transistor differential amplifier and a second differential input being from an input stage PNP transistor differential amplifier, to produce a single ended output suitable for driving a rail to rail output stage, said interstage circuit comprising:

first and second PNP transistors, the emitters of said first and second PNP transistors coupled to receive the first differential input, the base of said first PNP transistor connected to the base of said second PNP transistor, and the collector of said first PNP transistor connected to the base of said first PNP transistor;

third and fourth PNP transistors, the emitters of said third and fourth PNP transistors coupled to receive the first differential input, the base of said third PNP transistor connected to the base of said fourth PNP transistor, and the collector of said third PNP transistor connected to the base of said third PNP transistor, the emitter of said third PNP transistor connected to the emitter of said second PNP transistor, and the emitter of said fourth PNP transistor connected to the emitter of said first PNP transistor;

first and second NPN transistors, the emitters of said first and second NPN transistors coupled to receive the second differential input, the base of said first NPN transistor connected to the base of said second NPN transistor, and the collector of said first NPN transistor connected to the base of said first NPN transistor;

third and fourth NPN transistors, the emitters of said third and fourth NPN transistors coupled to receive the second differential input, the base of said third NPN transistor connected to the base of said fourth NPN transistor, and the collector of said third NPN transistor connected to the base of said third NPN transistor and, further, coupled to receive the collector current of the second PNP transistor, the emitter of said third NPN transistor connected to the emitter of said second NPN transistor, and the emitter of said fourth NPN transistor connected to the emitter of said first NPN transistor;

a first resistor that couples the emitters of the first and fourth PNP transistors to the positive power supply rail;

a second resistor that couples the emitters of the second and third PNP transistors to the positive power supply rail;

a third resistor that couples the emitters of the first and fourth NPN transistors to the negative power supply rail;

a fourth resistor that couples the emitters of the second and third NPN transistors to the negative power supply rail;

means for coupling the collector of the third PNP transistor to the collector of the second NPN transistor; and means for coupling the collector of the first PNP transistor to a first substantially constant current source having a first current;

means for coupling the collector of the first NPN transistor to a second substantially constant current source having a second current, said second current being substantially equal to said first current; and means for coupling the collector of the fourth PNP transistor to the collector of the fourth NPN transistor, wherein the single ended output appears at an output node between the collector of the fourth PNP transistor and the collector of the fourth NPN transistor;

and the output stage having output stage input and output terminals, positive and negative power supply rails connectable to a source of operating power and a pair of complementary common-emitter output transistors coupled between said power supply rails without any intervening circuit components, whereby the collectors of said output transistors comprise said output stage output terminal, said output stage comprising:

a pair of complementary emitter follower buffer drivers coupled to drive the bases of said output transistors;

a complementary pair of differential amplifiers, having inverting and non-inverting inputs and having outputs coupled to drive said buffer drivers;

a PNP voltage buffer transistor the emitter of which is coupled to the inverting inputs of said pair of differential amplifiers, the base of which is coupled to a first source of bias potential, and the collector of which is coupled to the base of said second NPN transistor;

means for coupling the non-inverting inputs of said pair of differential amplifiers together to comprise an input node;

means for coupling the input node to said output stage input terminal; and means for coupling said output stage input terminal to said interstage circuit output terminal.

8. The combined interstage and output stage circuit of claim 7, further comprising:

a NPN buffer voltage transistor, the emitter of which is coupled to the emitter of the PNP buffer voltage transistor, the base of which is connected to a second source of bias potential, and the collector of which is coupled to the base of the first PNP transistor.

9. The combined interstage and output stage circuit of claim 7, wherein said first source of bias potential is half the power supply rail.

10. The combined interstage and output stage circuit of claim 8, wherein said second source of bias potential is half the power supply rail, plus an amount of voltage developed across one diode.

11. A interstage circuit functioning to combine a first differential voltage and a second differential voltage, the first and second differential voltages being either positive or negative, to produce a current at a single ended output, said interstage circuit comprising:

first means for generating a first current, the first current exceeding a first bias current by an amount corresponding to the first differential voltage, if the first differential voltage is positive, and the first current being equal to the first bias current if the first differential voltage is not positive;

second means for generating a second current, the second current exceeding a second bias current by an amount corresponding to the second differential voltage, if the second differential voltage is positive, and the second current being equal to the second bias current if the second differential voltage is not positive;

third means for generating a third current, the third current exceeding said second current by an amount corresponding to the first differential voltage, if the first differential voltage is negative, and the third current being equal to said second bias current if the first differential voltage is not negative; and fourth means for generating a fourth current, the fourth current exceeding said first current by an amount corresponding to the second differential voltage, if the second differential voltage is negative, and the fourth current being equal to said first current if the second differential voltage is not negative; and fifth means, for subtracting said third current from said fourth current to produce the current at the single ended output.

12. The interstage circuit of claim 11, further comprising:

a first bias current generator for producing said first bias current, said first bias current being substantially constant; and a second bias current generator for producing said second bias current, said second bias current being substantially constant.

13. The interstage circuit of claim 12, wherein said first bias current generator is said second bias current generator.

14. The interstage circuit of claim 11, further comprising:

means for generating said first differential voltage based on a first differential current; and means for generating said second differential voltage based on a second differential current.

* * * * *